United States Patent
Park et al.

(10) Patent No.: US 12,048,225 B2
(45) Date of Patent: Jul. 23, 2024

(54) ORGANIC LIGHT EMITTING DISPLAY DEVICE

(71) Applicant: LG DISPLAY CO., LTD., Seoul (KR)

(72) Inventors: Hyejeong Park, Jeonju-si (KR); Sumin Lee, Seoul (KR); Youngmin Oh, Yeosu-si (KR)

(73) Assignee: LG DISPLAY CO., LTD., Seoul (KR)

( * ) Notice: Subject to any disclaimer, the term of this patent is extended or adjusted under 35 U.S.C. 154(b) by 407 days.

(21) Appl. No.: 17/551,940

(22) Filed: Dec. 15, 2021

(65) Prior Publication Data

US 2022/0208895 A1 Jun. 30, 2022

(30) Foreign Application Priority Data

Dec. 31, 2020 (KR) .................. 10-2020-0188786

(51) Int. Cl.
*H10K 59/50* (2023.01)
*H10K 59/122* (2023.01)
*H10K 59/124* (2023.01)
*H10K 59/38* (2023.01)

(52) U.S. Cl.
CPC ........... *H10K 59/50* (2023.02); *H10K 59/122* (2023.02); *H10K 59/124* (2023.02); *H10K 59/38* (2023.02)

(58) Field of Classification Search
CPC .... H10K 59/50; H10K 59/122; H10K 59/124; H10K 59/38; H10K 59/126; H10K 50/86; G02B 5/3016
See application file for complete search history.

(56) References Cited

U.S. PATENT DOCUMENTS

| | | | |
|---|---|---|---|
| 2003/0112394 A1* | 6/2003 | Yoshida | G02F 1/133753 349/123 |
| 2007/0222930 A1* | 9/2007 | Fukami | G02F 1/1395 349/126 |
| 2010/0208192 A1* | 8/2010 | Mochizuki | G02F 1/1341 349/189 |
| 2014/0104541 A1* | 4/2014 | Park | G02B 6/0023 362/622 |
| 2014/0111753 A1* | 4/2014 | Kobayashi | G02F 1/133707 349/123 |
| 2020/0381668 A1* | 12/2020 | Saitoh | H10K 59/12 |

(Continued)

*Primary Examiner* — Victor A Mandala
(74) *Attorney, Agent, or Firm* — Morgan, Lewis & Bockius LLP (57) ABSTRACT

An organic light-emitting display device includes a first substrate having sub-pixel areas, each sub-pixel area having a light-emitting area and a non-light-emitting area; thin-film transistors respectively in non-light-emitting areas of the sub-pixel areas; a first planarization layer in the sub-pixel areas while covering the thin-film transistors; organic light-emitting elements on the first planarization layer and in light-emitting areas of the sub-pixel areas; a liquid crystal layer on the organic light-emitting elements and in the sub-pixel areas and in an area between the sub-pixel areas; and a second substrate on the liquid crystal layer. Liquid crystal molecules of the liquid crystal layer in the light-emitting areas are in a hybrid alignment. In the hybrid alignment, an alignment of the liquid crystal molecules gradually changes from a horizontal alignment to a vertical alignment. Liquid crystal molecules of the liquid crystal layer in the non-light-emitting areas are in a tilted alignment.

17 Claims, 7 Drawing Sheets

FIG. 4

(56) References Cited

U.S. PATENT DOCUMENTS

| | | | |
|---|---|---|---|
| 2020/0399536 A1* | 12/2020 | Kim | H05B 33/14 |
| 2020/0403187 A1* | 12/2020 | Saitoh | H10K 59/50 |
| 2021/0048702 A1* | 2/2021 | Yuan | G02F 1/133753 |
| 2021/0115333 A1* | 4/2021 | Min | C01G 9/08 |
| 2021/0216148 A1* | 7/2021 | Wang | G02F 1/29 |

* cited by examiner

ORGANIC LIGHT EMITTING DISPLAY DEVICE

CROSS-REFERENCE TO RELATED APPLICATION

This application claims a benefit under 35 U.S.C. § 119(a) of Korean Patent Application No. 10-2020-0188786 filed on Dec. 31, 2020, on the Korean Intellectual Property Office, the entirety of disclosure of which is incorporated herein by reference for all purposes.

BACKGROUND

Technical Field

The present disclosure relates to an organic light-emitting display device, and more specifically, to an organic light-emitting display device capable of preventing color mixing and preventing external light reflection.

Discussion of the Related Art

As the information society develops, the demand for display devices is increasing in various forms. In response to this demand, display devices to which various display panels such as liquid crystal display panels, plasma display panels, and organic light-emitting display panels are applied are being researched and commercialized.

An organic light-emitting display device to which the organic light-emitting display panel is applied is a self-luminous display device. Unlike a liquid crystal display device, the organic light-emitting display device does not require a separate light source and thus is relatively light and thin. Further, the organic light-emitting display device operates at a low voltage, and has excellent characteristics in color rendering, response speed, viewing angle, contrast ratio, etc., and has been widely used in recent years.

However, as the organic light-emitting display device increases in size or resolution, sagging of a substrate and a fine metal mask occurs, so that it is difficult to form red, green, and blue organic light-emitting layers using the fine metal mask.

As a method to replace such method of forming the red, green, blue organic light-emitting layers using the fine metal mask, a structure in which white organic light-emitting layer is formed equally in all sub-pixels, and different color filters are employed for the sub-pixels has been proposed.

SUMMARY

An organic light-emitting display device has problems of color mixing resulted from light leakage defects between sub-pixel areas, and reflection of external light resulted from an increase in use of mobile devices.

Accordingly, embodiments of the present disclosure are directed to an organic light-emitting display device that substantially obviates one or more of the problems due to limitations and disadvantages of the related art.

An aspect of the present disclosure is to provide an organic light-emitting display device that has excellent color purity and color gamut by ameliorating light leakage defects between adjacent sub-pixel areas, and by preventing color mixing between the adjacent sub-pixel areas.

Another aspect of the present disclosure is to provide an organic light-emitting display device capable of preventing the reflection of the external light.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

According to one embodiment of the present disclosure, an organic light-emitting display device that may prevent color mixing between sub-pixel areas and ameliorate reflection of external light may be provided.

To achieve these and other aspects of the inventive concepts, as embodied and broadly described herein, an organic light-emitting display device comprises a first substrate having sub-pixel areas, wherein each sub-pixel area includes light-emitting area and non-light-emitting area, thin-film transistors respectively disposed in non-light-emitting areas of the respective sub-pixel areas, a first planarization layer disposed in the sub-pixel areas while covering the thin-film transistors, organic light-emitting elements disposed on the first planarization layer and disposed in light-emitting areas of the sub-pixel areas, a liquid crystal layer disposed on the organic light-emitting elements and disposed in the sub-pixel areas and an area between the sub-pixel areas, and a second substrate disposed on the liquid crystal layer. In this connection, liquid crystal molecules of the liquid crystal layer disposed in the light-emitting areas are in a hybrid alignment. In the hybrid alignment, an alignment of the liquid crystal molecules gradually changes from a horizontal alignment to a vertical alignment. In addition, liquid crystal molecules of the liquid crystal layer disposed in the non-light-emitting areas are in a tilted alignment.

In another aspect, an organic light-emitting display device comprises a first substrate including light-emitting portions and non-light-emitting portions, thin-film transistors disposed in each non-light-emitting portion, a first planarization layer disposed on the first substrate while covering the thin-film transistors, organic light-emitting elements disposed on the first planarization layer and disposed in the light-emitting portions, wherein the organic light-emitting elements emit white light linearly polarized in a first direction, a liquid crystal layer disposed on the organic light-emitting elements and disposed in the light-emitting portions and the non-light-emitting portions, and a second substrate disposed on the liquid crystal layer. Liquid crystal molecules of the liquid crystal layer disposed in the light-emitting portion are in a hybrid alignment. In the hybrid alignment, an alignment of the liquid crystal molecules gradually changes from a horizontal alignment to a vertical alignment. In addition, liquid crystal molecules of the liquid crystal layer disposed in the non-light-emitting portion are in a tilted alignment.

According to the present disclosure, the liquid crystal molecules of the liquid crystal layer disposed in the light-emitting portion equipped with the organic light-emitting elements and the like are in a hybrid alignment in which an alignment changes from a horizontal alignment to a vertical alignment, so that the color mixing between the adjacent sub-pixel areas may be prevented. Accordingly, a color purity and a color gamut of an image displayed by the organic light-emitting display device may be improved.

According to the present disclosure, the liquid crystal molecules of the liquid crystal layer disposed in the non-light-emitting portion equipped with the thin-film transistors and the like are in the tilted alignment, so that the reflection of the external light may be reduced.

Further, according to the present disclosure, the liquid crystal molecules are in the different alignments in the light-emitting portion and the non-light-emitting portion, so that the color mixing prevention and the external light reflection prevention may be achieved at the same time using a single liquid crystal layer.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light-emitting display device according to various embodiments of the present disclosure will be described in detail.

Figure 1:
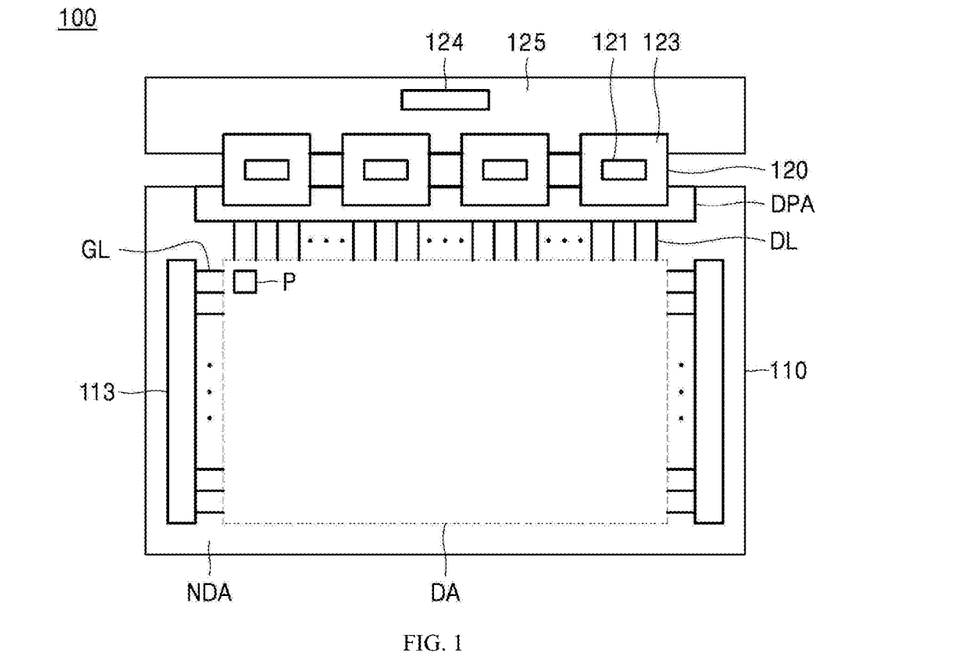
FIG. 1 is a plan view schematically showing a configuration of an organic light-emitting display device according to one embodiment of the present disclosure.
Figure 2:
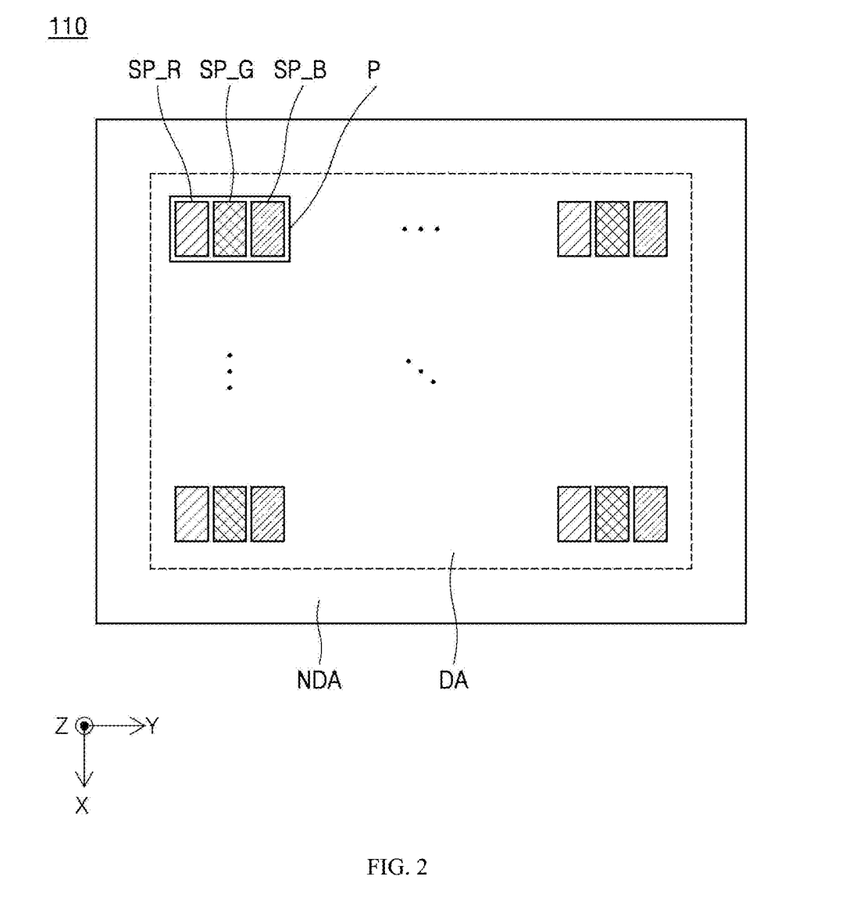
FIG. 2 is a plan view schematically showing a display panel of an organic light-emitting display device according to one embodiment of the present disclosure.

FIG. 1 is a plan view schematically showing a configuration of an organic light-emitting display device according to one embodiment of the present disclosure. However, connection and arrangement relationships between components of the organic light-emitting display device according to one embodiment of the present disclosure are not limited thereto. FIG. 2 is a plan view schematically showing a display panel of an organic light-emitting display device according to one embodiment of the present disclosure.

Referring to FIGS. 1 and 2, an organic light-emitting display device 100 may include a display panel 110, a timing controller 124, a data driver 120, and a gate driver 113.

The display panel 110 may include a display area DA that includes pixel arrays to display an image and non-display areas NDA that do not display the image.

The non-display areas NDA may be disposed to surround the display area DA. The gate driver 113, a data drive IC pad DPA, and various lines may be disposed in the non-display area NDA. The non-display area NDA may correspond to a bezel.

The display panel 110 may include a plurality of pixel areas P formed by a plurality of gate lines GL disposed in one direction and a plurality of data lines DL disposed in the other direction to be orthogonal to the gate lines GL.

The pixel areas P may be arranged in a matrix form, and each pixel area P may include a plurality of sub-pixel areas SP. Each pixel area P may include, for example, a red sub-pixel area SP_R, a green sub-pixel area SP_G, and a blue sub-pixel area SP_B.

The gate driver 113 controls on/off of driving thin-film transistors of the pixels in response to a gate control signal applied from the timing controller 124, and ensures that a data voltage applied from the data driver 120 is provided to an appropriate pixel circuit. To this end, the gate driver 113 sequentially outputs gate signals such as scan signals or light-emitting signals, and sequentially supplies the gate signals to the gate lines GL.

The gate driver 113 may include at least one gate driver integrated circuit (gate driver IC), and may be located on one side or each of both sides of the display panel 110 depending on a driving method or a design method of the display panel 110.

As for the gate driver 113, as shown in FIG. 1, the gate driver integrated circuit may be directly formed on the display panel 110 in a gate driver in panel (GIP) scheme. The gate driver 113 formed using the GIP scheme may be disposed in each non-display area NDA, which is each of left and right areas disposed outwardly of the display area DA. Further, the gate driver integrated circuit may be connected to a bonding pad of the display panel 110 in a tape automated bonding (TAB) scheme or a chip-on-glass (COG) scheme, or implemented in a chip-on film (COF) scheme.

The data driver 120 converts image data received from the timing controller 124 into an analog data voltage when a specific gate line GL is opened, and supplies the data voltage to the data line DL in synchronization with the gate control signal.

The data driver 120 may include at least one source driver integrated circuit (source driver IC) 121 to drive a number of data lines DL. Each source driver integrated circuit 121 may be connected to the bonding pad of the display panel 110 in the tape automated bonding (TAB) scheme or the chip-on-glass (COG) scheme, or directly placed or integrated on the display panel 110. Further, each source driver integrated circuit 121 may be implemented in the chip on film (COF) scheme. For example, as shown in FIG. 1, each source driver integrated circuit 121 is mounted on a flexible film 123. One end of the flexible film 123 is bonded to at least one control printed circuit board 150, and the other end thereof is bonded to a data drive IC pad DPA of the display panel 110.

Accordingly, lines connecting the data drive IC pad DPA of the display panel 110 with the source driver integrated circuit 121, and lines connecting the data drive IC pad DPA with lines of the control printed circuit board 125 may be formed on the flexible film 123.

A number of circuits implemented with driving chips may be mounted on the control printed circuit board 125. For example, the timing controller 124 may be placed on the control printed circuit board 125 as shown in FIG. 1. In addition, on the control printed circuit substrate 125, a power controller that supplies various voltages or currents to the display panel 110, the data driver 120, and the gate driver 113 or controls the various voltages or currents to be supplied may be further disposed.

The timing controller 124 provides the gate control signal to the gate driver 113, and provides the data control signal to the data driver 120 to control the data driver 120 and the gate driver 113.

Further, the timing controller 124 starts scan based on a timing implemented in each frame, converts an input image data input from the outside based on a data signal format used by the data driver 120 to output the converted image data, and control data driving at an appropriate time based on the scan.

Figure 3:
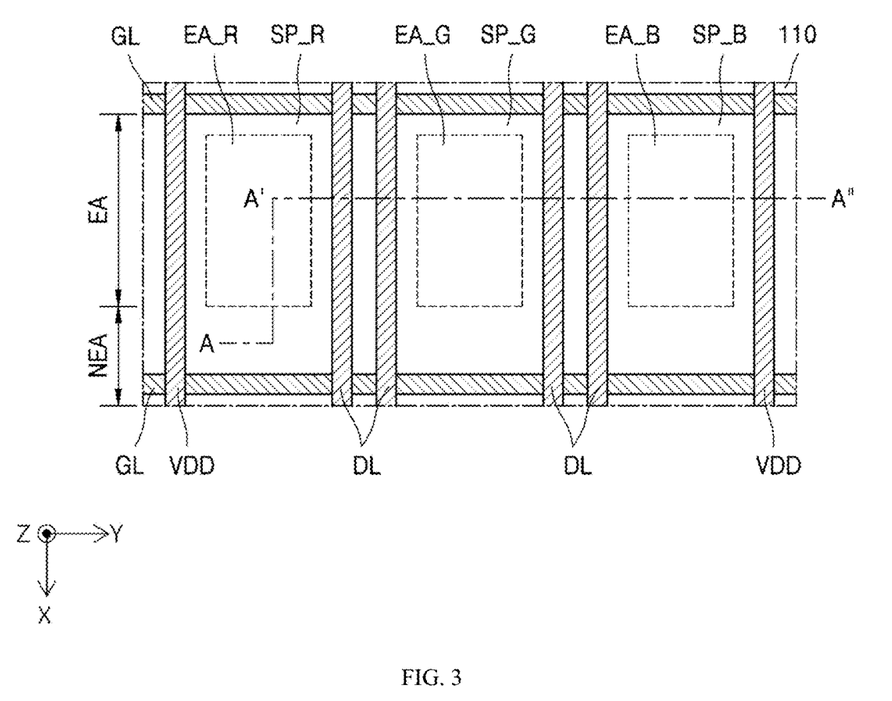
FIG. 3 is a plan view schematically showing a pixel area of an organic light-emitting display device according to one embodiment of the present disclosure.

FIG. 3 is a plan view schematically showing a pixel area of an organic light-emitting display device according to one embodiment of the present disclosure, which schematically shows a plane of the pixel area of a three-color (R, G, B) organic light-emitting display device.

Referring to FIG. 3, signal lines including a gate line GL, a data line DL and a driving voltage line VDD are disposed on the first substrate 105. The gate line GL crosses the data line DL and the driving voltage line VDD. The gate line GL may extend in a y-axis direction, and the data line DL and the driving voltage line VDD may extend in a x-axis direction.

According to the present embodiment, on the first substrate 105, a red sub-pixel area SP_R, a green sub-pixel area SP_G, and a blue sub-pixel area SP_B may be defined by the aforementioned signal lines. The first substrate 105 may include the red sub-pixel area SP_R, the green sub-pixel area SP_G, and the blue sub-pixel area SP_B defined by the above-described signal lines.

For example, the red sub-pixel area SP_R and the blue sub-pixel area SP_B may be defined by two gate lines GL extending parallel to each other and the driving voltage line VDD and the data line DL crossing the gate lines GL. Further, the green sub-pixel area SP_G may be defined by two gate lines GL extending parallel to each other and two data lines DL intersecting the same. An arrangement order of the sub-pixel areas, and a type and the number of signal lines extending between the adjacent sub-pixel areas are not limited to the drawing and may be changed.

The red sub-pixel area SP_R, the green sub-pixel area SP_G, and the blue sub-pixel area SP_B defined on the first substrate 105 contain a red light-emitting area EA_R, a green light-emitting area EA_G, and a blue light-emitting area EA_B, respectively. In addition to the light-emitting area, each sub-pixel area includes a driving circuit area in which the thin-film transistor TFT and the like are placed. The red sub-pixel area SPR includes the red light-emitting area EA_R and the driving circuit area, the green sub-pixel area SP_G includes the green light-emitting area EA_G and the driving circuit area, and the blue sub-pixel area SP_B includes the blue light-emitting area EA_B and the driving circuit area.

Figure 4:
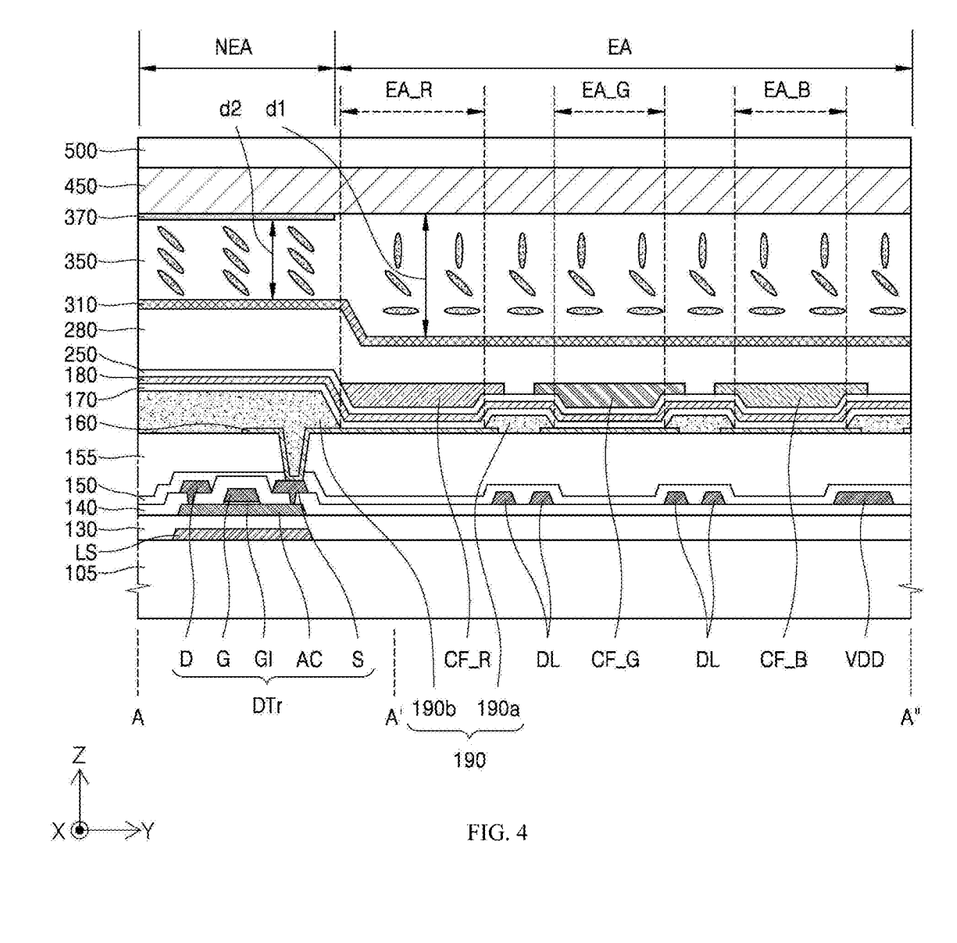
FIG. 4 is a cross-sectional view showing an organic light-emitting display device cut along A-A' and A'-A" cutting lines in FIG. 3.

The red light-emitting area EA_R, the blue light-emitting area EA_B, and the green light-emitting area EA_G may be defined by a bank 190 (see FIG. 4). The red light-emitting area EA_R, the green light-emitting area EA_G, and the blue light-emitting area EA_B may correspond to opening areas of the bank 190, respectively. The signal lines and the driving circuit areas described above may be covered by the bank 190. That is, the signal lines and the driving circuit areas described above may be placed beneath the bank 190 so as to overlap with the bank 190.

Further, the first substrate 105 includes light-emitting portions EA and non-light-emitting portions NEA. The light-emitting portions EA and the non-light-emitting portions NEA may be arranged in a manner in which each light-emitting portion EA and each non-light-emitting portion NEA are alternately arranged with each other in the x-axis direction, that is, the direction in which the data line DL extends. Each of the light-emitting portion EA and the non-light-emitting portion NEA may be a portion of the first substrate 105 extending in the y-axis direction, that is, in the direction in which the gate line GL extends. The light-emitting portion EA may include, for example, the red light-emitting area EA_R, the blue light-emitting area EA_B, and the green light-emitting area EA_G. The non-light-emitting portions NEA may include the driving circuit areas including the thin-film transistor TFTs and the like. Further, the gate line GL may be disposed in the non-light-emitting portion NEA. The driving circuit area of the sub-pixel area may be referred to as the non-light-emitting area.

FIG. 4 is a cross-sectional view showing an organic light-emitting display device cut along A-A' and A'-A" cutting lines in FIG. 3. In particular, a cross section cut along the A-A' cutting line in this drawing represents a cross section of the non-light-emitting portion NEA equipped with the thin-film transistor TFT of the organic light-emitting display device according to one embodiment of the present disclosure and a portion of the light-emitting portion EA. Further, a cross section cut according to the A'-A" cutting line represents a cross section of the light-emitting portions EA of the organic light-emitting display device according to one embodiment of the present disclosure.

On the substrate 105, a light-blocking layer LS, a buffer layer 130, the thin-film transistor TFT, an interlayer insulating layer 140, a first passivation layer 150, a first planarization layer 155, the bank 190, a first electrode 160, an organic light-emitting layer 170, a second electrode 180, a second passivation layer 250, color filters CF_R, CF_B, and CF_G, a second planarization layer 280, a first alignment layer 310, a liquid crystal layer 350, a second alignment layer 370, a second substrate 450, a polarization layer 500, and the like may be disposed.

The light-blocking layer LS may be disposed on the first substrate 105 to overlap an active layer A of the thin-film transistor TFT. The light-blocking layer LS may be made of a metal such as molybdenum (Mo), aluminum (Al), chromium (Cr), and silver (Ag), or an alloy thereof. However, the present disclosure is not limited thereto. The light-blocking layer LS may be made of various materials known in the art. The light-blocking layer LS may prevent external light from invading the active layer A of the thin-film transistor TFT.

The buffer layer 130 may be disposed on the light-blocking layer LS and cover the light-blocking layer LS. According to an example, the buffer layer 130 may be formed by stacking a plurality of inorganic layers. For example, the buffer layer 130 may be formed of a multilayer in which at least two inorganic layers among a silicon oxide layer $SiO_x$, a silicon nitride layer $SiN_x$, and a silicon oxynitride layer SiON are stacked vertically. This buffer layer 130 may be formed on an entire top face of the first substrate 105 to prevent moisture from penetrating into the organic light-emitting element through the first substrate 105.

The thin-film transistor TFT may be disposed on the buffer layer 130. According to an example, the thin-film transistor TFT may include the active layer AC, a gate electrode G, a drain electrode D, and a source electrode S. The active layer AC may be disposed on the buffer layer 130 so as to overlap with the light-blocking layer LS. The active layer AC may be in direct contact with source electrode S and the drain electrode D. The active layer AC may face the gate electrode G while the gate insulating film GI may be interposed therebetween. The gate insulating film GI may only be disposed between the gate electrode G and the active layer AC. Alternatively, the film GI may be disposed on the active layer AC and the buffer layer 130. The gate electrode G may be disposed on the gate insulating film GI. The gate electrode G may overlap with the active layer AC while the gate insulating film GI is interposed therebetween.

The interlayer insulating layer 140 may be disposed on the gate electrode G, the active layer AC, and the buffer layer 130. The interlayer insulating film 140 may protect the thin-film transistor TFT and may insulate the drain electrode D and the source electrode S from the gate electrode G. The interlayer insulating layer 140 may be partially removed to allow contact between the active layer AC and the source electrode S or the drain electrode D. For example, the interlayer insulating layer 140 may include contact holes through which the source electrode S and the drain electrode D pass.

The drain electrode D and the source electrode S may be spaced apart from each other and disposed on the interlayer insulating layer 140. The drain electrode D may contact one side of the active layer AC via one contact hole provided in the interlayer insulating layer 140, while the source electrode S may contact the opposite side of the active layer AC via the opposite contact hole provided in the interlayer insulating layer 140.

FIG. 4 shows that the thin-film transistor TFT has a top gate structure. However, the present disclosure is not limited thereto. The thin-film transistor TFT may have a bottom gate structure, or a double gate structure.

The signal lines defining each sub-pixel area may be located on the interlayer insulating layer 140. For example, the data lines DL may be located between the red light-emitting area EA_R and the blue light-emitting area EA_B and between the blue light-emitting area EA_B and the green light-emitting area EA_G. The driving voltage line VDD may be located between the green light-emitting area EA_G and the adjacent red light-emitting area EA_R.

The first passivation layer 150 may be disposed on the interlayer insulating layer 140 and the thin-film transistor TFT. The first passivation layer 150 may protect the thin-film transistor TFT. The first passivation layer 150 may be made of an inorganic insulating material such as silicon oxide and silicon nitride, or an organic insulating material such as photoacrylic or benzocyclobutene.

The first planarization layer 155 may be disposed on the first passivation layer 150 to remove an unevenness caused by the, thin-film transistor TFT and the like. The first planarization layer 155 may be made of an organic insulating material such as photoacrylic or benzocyclobutene.

On the first planarization layer 155, the first electrode 160 electrically connected to the source electrode S of the thin-film transistor TFT through the first planarization layer 155 and the first passivation layer 150 is disposed.

Figure 8:
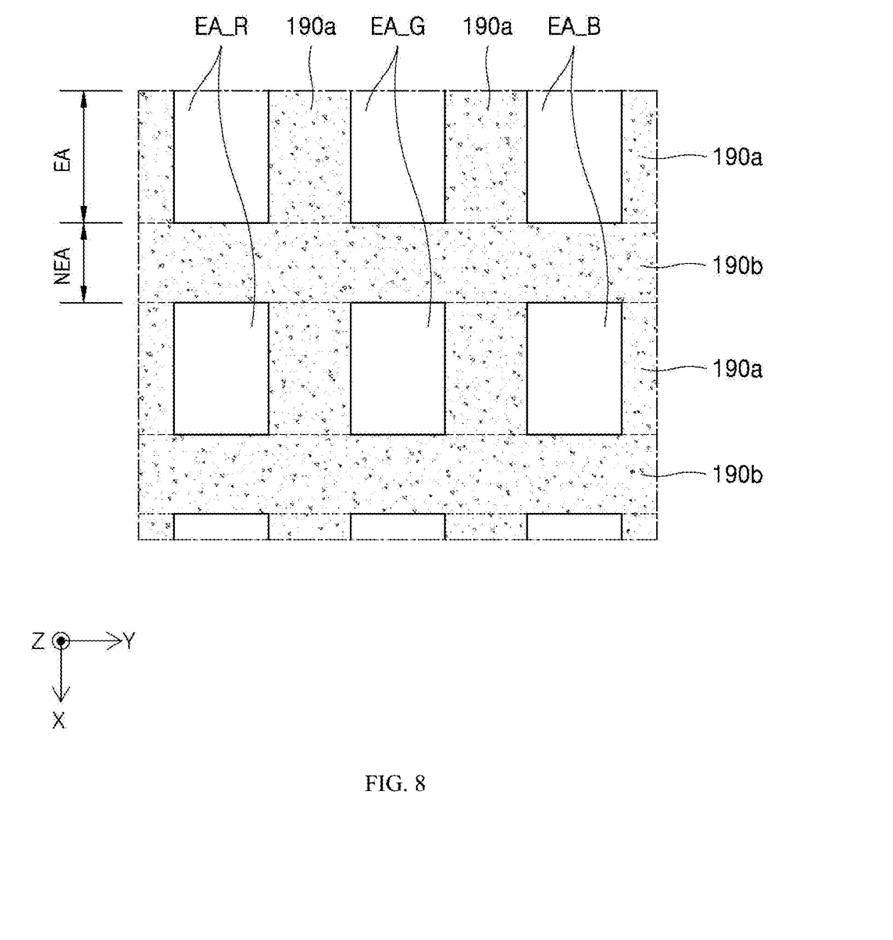
FIG. 8 is a plan view showing a bank of an organic light-emitting display device according to one embodiment of the present disclosure.

The bank 190 is disposed along an edge of the first electrode 160 to define light-emitting areas. Specifically, a first bank area 190a of the bank 190 may be disposed in the light-emitting portion EA, and a second bank area 190b of the bank 190 may be disposed in the non-light-emitting portion NEA. Referring to FIG. 8, the first bank areas 190a may be arranged alternately with the light-emitting areas in the y-axis direction. The first bank areas 190a may be disposed between the red light-emitting area EA_R and the green light-emitting area EA_G, between the green light-emitting area EA_G and the blue light-emitting area EA_B, and between the blue light-emitting area EA_B and the red light-emitting area EA_R, respectively. The second bank area 190b may extend in the y-axis direction, and may be placed between two adjacent red light-emitting areas EA_R, between two adjacent green light-emitting areas EA_G, and between two adjacent blue light-emitting areas EA_B. A thickness of the second bank area 190b may be greater than that of the first bank area 190a. As such, by making the thickness of the second bank area 190b larger than that of the first bank area 190a, a thickness of a portion of the liquid crystal layer 350 disposed in the non-light-emitting portion NEA may be made smaller than that of the remaining portion of the liquid crystal layer 350 disposed in the light-emitting portion EA.

The organic light-emitting layer 170 and the second electrode 180 are sequentially stacked on the bank 190 and the first electrode 160. In this connection, the first electrode 160, the organic light-emitting layer 170, and the second electrode 180 constitute an organic light-emitting element. The organic light-emitting layer 170 may emit white light. In particular, the organic light-emitting layer 170 may emit white light linearly polarized in the y-axis direction, for example. The organic light-emitting layer 170 will be described later with reference to FIGS. 5 and 6.

The second passivation layer 250 may be disposed on the second electrode 180. The second passivation layer 250 may protect the second electrode 180. The second passivation layer 250 may be made of an inorganic insulating material such as silicon oxide and silicon nitride, or may be made of an organic insulating material such as photoacrylic or benzocyclobutene.

In the light-emitting portion EA, the color filters CF_R, CF_G, and CF_B may be disposed on the second passivation layer 250. The red light-emitting area EA_R is equipped with the red color filter CF_R, the green light-emitting area EA_G is equipped with the green color filter CF_G, and the blue light-emitting area EA_B is equipped with the blue color filter CF_B.

A second planarization layer 280 that covers the color filters CF_R, CF_G, and CF_B may be disposed on the second passivation layer 250.

The first alignment layer 310, the liquid crystal layer 350, and the second alignment layer 370 may be sequentially stacked on the second planarization layer 280.

The liquid crystal layer 350 may include, for example, positive c-plate liquid crystal molecules. A refractive index anisotropy $\Delta n$ of the liquid crystal molecules may be 0.05 to 0.2.

Figure 7:
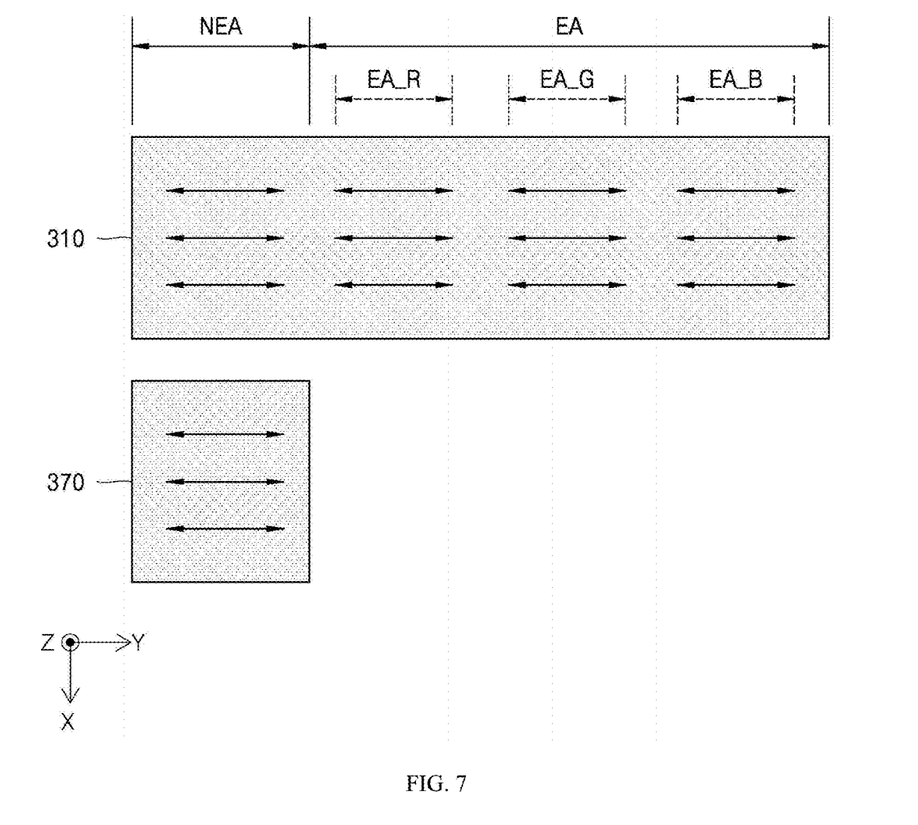
FIG. 7 is a plan view showing alignments of first and second alignment layers for aligning a liquid crystal layer according to one embodiment of the present disclosure.

The first alignment layer 310 and liquid crystal layer 350 may be placed in both of the light-emitting portion EA and the non-light-emitting portion NEA, and the first alignment layer 370 may only be placed in the non-light-emitting portion NEA. The first alignment layer 310 and the second alignment layer 370 may be made of polyimide. The first alignment layer 310 and the second alignment layer 370 may be aligned in the same direction. For example, as shown in FIG. 7, the first alignment layer 310 and the second alignment layer 370 may be aligned in the y-axis direction. For this reason, liquid crystal molecules of the portion of the liquid crystal layer 350 placed in the light-emitting portion EA including the light-emitting areas and liquid crystal molecules of the portion of the liquid crystal layer 350 placed in the non-light-emitting portion NEA including the non-light-emitting areas may be aligned in different alignments. The liquid crystal molecules of the portion of the liquid crystal layer 350 placed in the light-emitting portion EA including the light-emitting areas may be in a hybrid alignment (also, referred to as a splay alignment) in which the alignment is changed from a horizontal alignment to a vertical alignment from a bottom to a top of the liquid crystal layer 350. The liquid crystal molecules of the portion of the liquid crystal layer 350 placed in the non-light-emitting portion NEA including the non-light-emitting areas may be in a tilted alignment of having, for example, a slope of 45 degrees with respect to a top face of the first alignment layer 310.

A thickness d1 of the portion of the liquid crystal layer 350 disposed in the light-emitting portion EA including the light-emitting areas may be greater than a thickness d2 of the portion of the liquid crystal layer 350 disposed in the non-light-emitting portion NEA including the non-light-emitting areas. For example, the thickness d1 of the portion of the liquid crystal layer 350 disposed in the light-emitting portion EA including the light-emitting areas may be three times the thickness d2 of the portion of the liquid crystal layer 350 disposed in the non-light-emitting portion NEA including the non-light-emitting areas. For example, when the refractive index anisotropy Δn of the liquid crystal molecules is 0.13, he thickness d1 of the portion of the liquid crystal layer 350 disposed in the light-emitting portion EA including the light-emitting areas may be 3.3 μm, and the thickness d2 of the portion of the liquid crystal layer 350 disposed in the non-light-emitting portion NEA including the non-light-emitting areas may be 1.1 μm.

Accordingly, the portion of the liquid crystal layer 350 placed in the light-emitting portion EA including the light-emitting areas may have a phase delay of λ/2 with respect to a viewing angle of 45 degrees, and the portion of the liquid crystal layer 350 placed in the non-light-emitting portion NEA including the non-light-emitting areas may have a phase delay of 214 with respect to a front side.

The second substrate 450 may be disposed on the second alignment layer 370 and the liquid crystal layer 350. The second substrate 450 may be a glass substrate. It may be understood that the second alignment layer 370 is disposed on an area of the second substrate 450 corresponding to the non-light-emitting portion NEA, including the non-light-emitting areas of the first substrate 105.

The polarization layer 500 is disposed on the second substrate 450. The polarization layer 500 may be aligned in the x-axis direction so as to transmit light linearly polarized in the y-axis direction. Thus, the polarization layer 500 may transmit the white light linearly polarized in the y-axis direction, which is emitted from the organic light-emitting layer 170.

Thus, according to one embodiment of the present disclosure, because the portion of the liquid crystal layer 350 disposed in the light-emitting portion EA including the light-emitting areas has the phase delay of λ/2 with respect to the viewing angle of 45 degrees, the light linearly polarized in the y-axis direction, which is emitted from the organic light-emitting layer 170, is converted into light linearly polarized in the x-axis direction by λ/2 while passing through the liquid crystal layer 350, and is blocked by the polarization layer 500 on the top face of the second substrate 450. Accordingly, color mixing between the sub-pixel areas may be prevented in the light-emitting portion EA.

In addition, according to one embodiment of the present disclosure, because the portion of the liquid crystal layer 350 disposed in the non-light-emitting portion NEA including the non-light-emitting areas has the phase delay of λ/4 with respect to the front side, in the non-light-emitting portion NEA, external light passes through the polarization layer 500 on the top face of the second substrate 450 and is linearly polarized in the y-axis direction, then, is right-circularly polarized by λ/4 while passing through the liquid crystal layer 350, then, is internally reflected again and left-circularly polarized, then, is converted into light linearly polarized in the x-axis direction by λ/4 while passing through the liquid crystal layer 350, and then, is blocked by the polarization layer 500 disposed on the top face of the second substrate 450. Accordingly, reflection of the external light may be prevented in the non-light-emitting portion NEA.

Figure 5:
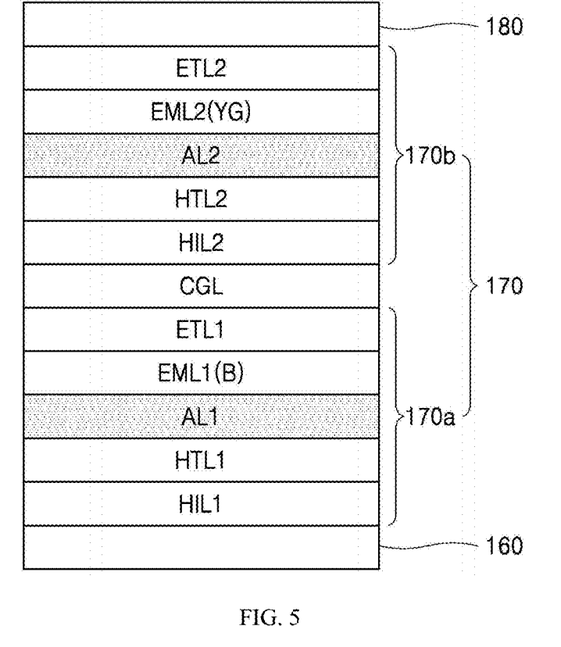
FIG. 5 is a cross-sectional view showing an organic light-emitting element of an organic light-emitting display device according to one embodiment of the present disclosure.
Figure 6:
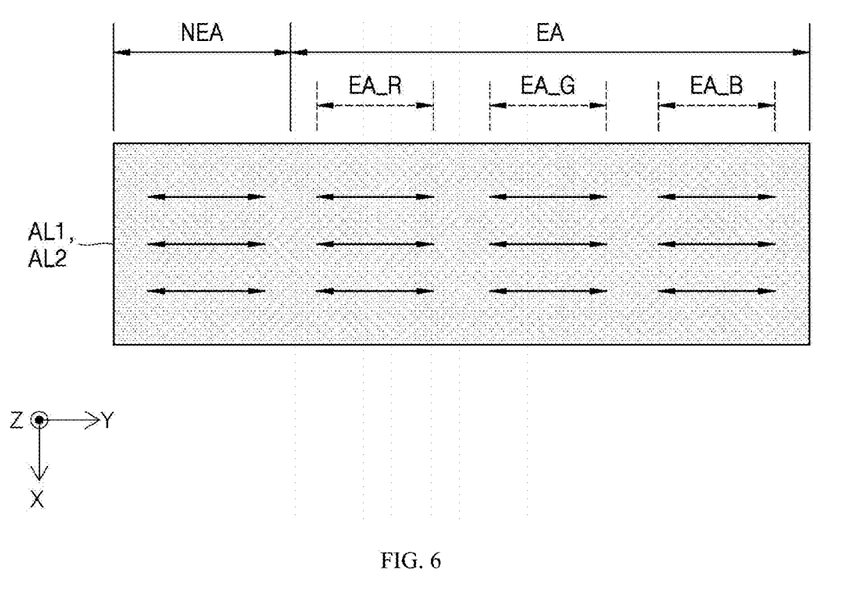
FIG. 6 is a plan view showing an alignment of light-emitting alignment layers in an organic light-emitting element according to one embodiment of the present disclosure.

FIG. 5 is a cross-sectional view showing an organic light-emitting element of an organic light-emitting display device according to one embodiment of the present disclosure. FIG. 6 is a plan view showing an alignment of light-emitting alignment layers in an organic light-emitting element according to one embodiment of the present disclosure.

As shown in FIG. 5, the organic light-emitting layer 170 is composed of a charge generating layer CGL, and a first light-emitting unit 170a and a second light-emitting unit 170b formed with the charge generating layer CGL interposed therebetween. The first light-emitting unit 170a includes first hole injection layer HIL1, a first hole transport layer HTL1, a first light-emitting alignment layer AL1, a first light-emitting layer EML1, and a first electron transport layer ETL1. The second light-emitting unit 170b includes a second hole injection layer HIL2, a second hole transport layer HTL2, a second light-emitting alignment layer AL2, a second light-emitting layer EML2, and a second electron transport layer ETL2. The first light-emitting layer EML1 of the first light-emitting unit 170a includes a fluorescent host containing a blue dopant to emit blue light in a range of 400 nm to 490 nm, and the second light-emitting layer EML2 of the second light-emitting unit 134b includes a yellow-green dopant and a phosphorescent host to emit yellow-green light in a range of 500 nm to 640 nm. In particular, the first light-emitting alignment layer AL1 and the second light-emitting alignment layer AL2 may be made of polyimide, and may be, for example, aligned in the y-axis direction. Accordingly, the first light-emitting unit 170a formed on the first light-emitting alignment layer AL1 emits blue light linearly polarized in the y-axis direction, and the second light-emitting unit 170b formed on the second light-emitting alignment layer AL2 emits yellow-green light linearly polarized in the y-axis direction. Therefore, the blue light of the first light-emitting unit 170a and the yellow-green light of the second light-emitting unit 170b are mixed with each other, so that the organic light-emitting layer 170 may emit white light linearly polarized in the y-axis direction.

In addition, the organic light-emitting layer 170 may implement white light using other fluorescent and phosphorescent dopants. For example, the first light-emitting layer EML1 may be composed of a blue light-emitting layer, and the second light-emitting layer EML2 may be composed of a red light-emitting layer and a green light-emitting layer.

So far, with reference to the drawings, the three-color (R, G, B) organic light-emitting display device including the red, green, and blue sub-pixel areas has been described. However, the technical idea of the present disclosure may also be applied to a four-color (R, W, G, and B) organic light-emitting display device including red, white, green, and blue sub-pixel areas.

Embodiments of the present disclosure may be described as follows.

A first aspect of the present disclosure provides an organic light-emitting display device comprising: a first substrate having sub-pixel areas, wherein each sub-pixel area includes light-emitting area and non-light-emitting area; thin-film transistors respectively disposed in non-light-emitting areas of the sub-pixel areas; a first planarization layer disposed in the sub-pixel areas while covering the thin-film transistors; organic light-emitting elements disposed on the first planarization layer and disposed in light-emitting areas of the sub-pixel areas; a liquid crystal layer disposed on the organic light-emitting elements and disposed in the sub-pixel areas and in an area between the sub-pixel areas; and a second substrate disposed on the liquid crystal layer. Liquid crystal molecules of the liquid crystal layer disposed in the light-emitting areas are in a hybrid alignment. In the hybrid alignment, an alignment of the liquid crystal molecules gradually changes from a horizontal alignment to a vertical alignment. In addition, liquid crystal molecules of the liquid crystal layer disposed in the non-light-emitting areas are in a tilted alignment.

In one implementation of the first aspect, the device further comprises: a polarization layer disposed on the second substrate, and the polarization layer transmits light linearly polarized in a first direction, and organic light-emitting layers of the organic light-emitting elements emit white light linearly polarized in the first direction.

In one implementation of the first aspect, the organic light-emitting layers include a first light-emitting alignment layer aligned in the first direction, a first light-emitting layer disposed on the first light-emitting alignment layer, a second light-emitting alignment layer aligned in the first direction, and a second light-emitting layer disposed on the second light-emitting alignment layer.

In one implementation of the first aspect, portions of the liquid crystal layer respectively disposed in the light-emitting areas have a phase delay of λ/2 with respect to a viewing angle of 45 degrees, and portions of the liquid crystal layer respectively disposed in the non-light-emitting areas have a phase delay of λ/4 with respect to a front side.

In one implementation of the first aspect, portions of the liquid crystal layer respectively disposed in the light-emitting areas have a thickness greater than a thickness of portions of the liquid crystal layer respectively disposed in the non-light-emitting areas.

In one implementation of the first aspect, the thickness of the portions of the liquid crystal layer disposed in the light-emitting areas is three times the thickness of the portion of the liquid crystal layer disposed in the non-light-emitting areas.

In one implementation of the first aspect, the device further comprises: color filters respectively disposed on the organic light-emitting elements; a second planarization layer covering the color filters; a first alignment layer disposed on the second planarization layer; and a second alignment layer disposed on areas of the second substrate corresponding to the non-light-emitting areas of the first substrate. The liquid crystal layer is disposed between the first alignment layer and the second substrate.

In one implementation of the first aspect, the first alignment layer and the second alignment layer are aligned in the first direction.

The organic light-emitting display device of claim 2, wherein the device further comprises: a bank disposed on the top face of the first planarization layer, wherein the bank defines the light-emitting areas, and the bank includes first bank areas alternately arranged with the light-emitting areas in the first direction, and second bank areas respectively disposed in the non-light-emitting areas and extending in the first direction. A thickness of the first bank areas is smaller than a thickness of the second bank areas.

A second aspect of the present disclosure provides an organic light-emitting display device comprising: a first substrate including light-emitting portions and non-light-emitting portions; thin-film transistors disposed in each non-light-emitting portion; a first planarization layer disposed on the first substrate while covering the thin-film transistors; organic light-emitting elements disposed on the first planarization layer and disposed in the light-emitting portions, wherein the organic light-emitting elements emit white light linearly polarized in a first direction; a liquid crystal layer disposed on the organic light-emitting elements and disposed in the light-emitting portions and the non-light-emitting portions; and a second substrate disposed on the liquid crystal layer. Liquid crystal molecules of the liquid crystal layer disposed in the light-emitting portion are in a hybrid alignment. In the hybrid alignment, an alignment of the liquid crystal molecules gradually changes from a horizontal alignment to a vertical alignment. In addition, liquid crystal molecules of the liquid crystal layer disposed in the non-light-emitting portion are in a tilted alignment.

In one implementation of the second aspect, the device further comprises: a polarization layer disposed on the second substrate, and the polarization layer transmits the light linearly polarized in the first direction.

In one implementation of the second aspect, organic light-emitting layers of the organic light-emitting elements include at least one light-emitting alignment layer aligned in the first direction and at least one light-emitting layer.

In one implementation of the second aspect, portions of the liquid crystal layer respectively disposed in the light-emitting portions have a thickness greater than a thickness of portions of the liquid crystal layer respectively disposed in the non-light-emitting portions.

In one implementation of the second aspect, the thickness of the portions of the liquid crystal layer disposed in the light-emitting portions is three times the thickness of the portion of the liquid crystal layer disposed in the non-light-emitting portions.

In one implementation of the second aspect, the device further comprises: color filters respectively disposed on the organic light-emitting elements; a second planarization layer covering the color filters; a first alignment layer disposed on the second planarization layer; and a second alignment layer disposed on areas of the second substrate corresponding to the non-light-emitting portions of the first substrate. The liquid crystal layer is disposed between the first alignment layer and the second substrate.

In one implementation of the second aspect, the first alignment layer and the second alignment layer are aligned in the first direction.

In one implementation of the second aspect, the device further comprises: a bank disposed on the first planarization layer, wherein the bank defines the light-emitting areas of the light-emitting portion, and the bank includes first bank areas alternately arranged with the light-emitting areas of the light-emitting portion in the first direction, and second bank areas disposed in the non-light-emitting portion and extending in the first direction. A thickness of the first bank areas is smaller than a thickness of the second bank areas.

It will be apparent to those skilled in the art that various modifications and variations can be made in the organic light-emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. An organic light-emitting display device comprising:
a first substrate having sub-pixel areas, wherein each sub-pixel area includes light-emitting area and non-light-emitting area;
thin-film transistors respectively disposed in non-light-emitting areas of the sub-pixel areas;
a first planarization layer disposed in the sub-pixel areas while covering the thin-film transistors;
organic light-emitting elements disposed on the first planarization layer and disposed in light-emitting areas of the sub-pixel areas;

a liquid crystal layer disposed on the organic light-emitting elements and disposed in the sub-pixel areas and in an area between the sub-pixel areas; and a second substrate disposed on the liquid crystal layer, wherein liquid crystal molecules of the liquid crystal layer disposed in the light-emitting areas are in a hybrid alignment, wherein in the hybrid alignment, an alignment of the liquid crystal molecules gradually changes from a horizontal alignment to a vertical alignment, wherein liquid crystal molecules of the liquid crystal layer disposed in the non-light-emitting areas are in a tilted alignment.

2. The organic light-emitting display device of claim 1, further comprising:

a polarization layer disposed on the second substrate, wherein the polarization layer transmits light linearly polarized in a first direction, and organic light-emitting layers of the organic light-emitting elements emit white light linearly polarized in the first direction.

3. The organic light-emitting display device of claim 2, wherein the organic light-emitting layers include a first light-emitting alignment layer aligned in the first direction, a first light-emitting layer disposed on the first light-emitting alignment layer, a second light-emitting alignment layer aligned in the first direction, and a second light-emitting layer disposed on the second light-emitting alignment layer.

4. The organic light-emitting display device of claim 1, wherein portions of the liquid crystal layer respectively disposed in the light-emitting areas have a phase delay of $\lambda/2$ with respect to a viewing angle of 45 degrees, and portions of the liquid crystal layer respectively disposed in the non-light-emitting areas have a phase delay of $\lambda/4$ with respect to a front side.

5. The organic light-emitting display device of claim 1, wherein portions of the liquid crystal layer respectively disposed in the light-emitting areas have a thickness greater than a thickness of portions of the liquid crystal layer respectively disposed in the non-light-emitting areas.

6. The organic light-emitting display device of claim 5, wherein the thickness of the portions of the liquid crystal layer disposed in the light-emitting areas is three times the thickness of the portion of the liquid crystal layer disposed in the non-light-emitting areas.

7. The organic light-emitting display device of claim 2, further comprising:

color filters respectively disposed on the organic light-emitting elements;

a second planarization layer covering the color filters;

a first alignment layer disposed on the second planarization layer; and a second alignment layer disposed on areas of the second substrate corresponding to the non-light-emitting areas of the first substrate, wherein the liquid crystal layer is disposed between the first alignment layer and the second substrate.

8. The organic light-emitting display device of claim 7, wherein the first alignment layer and the second alignment layer are aligned in the first direction.

9. The organic light-emitting display device of claim 2, further comprising:

a bank disposed on the first planarization layer, wherein the bank defines the light-emitting areas, wherein the bank includes first bank areas alternately arranged with the light-emitting areas in the first direction, and second bank areas respectively disposed in the non-light-emitting areas and extending in the first direction, wherein a thickness of the first bank areas is smaller than a thickness of the second bank areas.

10. An organic light-emitting display device comprising:

a first substrate including light-emitting portions and non-light-emitting portions;

thin-film transistors disposed in each non-light-emitting portion;

a first planarization layer disposed on the first substrate while covering the thin-film transistors;

organic light-emitting elements disposed on the first planarization layer and disposed in the light-emitting portions, wherein the organic light-emitting elements emit white light linearly polarized in a first direction;

a liquid crystal layer disposed on the organic light-emitting elements and disposed in the light-emitting portions and the non-light-emitting portions; and a second substrate disposed on the liquid crystal layer, wherein liquid crystal molecules of the liquid crystal layer disposed in the light-emitting portion are in a hybrid alignment, wherein in the hybrid alignment, an alignment of the liquid crystal molecules gradually changes from a horizontal alignment to a vertical alignment, wherein liquid crystal molecules of the liquid crystal layer disposed in the non-light-emitting portion are in a tilted alignment.

11. The organic light-emitting display device of claim 10, further comprising:

a polarization layer disposed on the second substrate, wherein the polarization layer transmits the light linearly polarized in the first direction.

12. The organic light-emitting display device of claim 10, wherein organic light-emitting layers of the organic light-emitting elements include at least one light-emitting alignment layer aligned in the first direction and at least one light-emitting layer.

13. The organic light-emitting display device of claim 10, wherein portions of the liquid crystal layer respectively disposed in the light-emitting portions have a thickness greater than a thickness of portions of the liquid crystal layer respectively disposed in the non-light-emitting portions.

14. The organic light-emitting display device of claim 13, wherein the thickness of the portions of the liquid crystal layer disposed in the light-emitting portions is three times the thickness of the portion of the liquid crystal layer disposed in the non-light-emitting portions.

15. The organic light-emitting display device of claim 10, further comprising:

color filters respectively disposed on the organic light-emitting elements;

a second planarization layer covering the color filters;

a first alignment layer disposed on the second planarization layer; and a second alignment layer disposed on areas of the second substrate corresponding to the non-light-emitting portions of the first substrate, wherein the liquid crystal layer is disposed between the first alignment layer and the second substrate.

16. The organic light-emitting display device of claim 15, wherein the first alignment layer and the second alignment layer are aligned in the first direction.

17. The organic light-emitting display device of claim 10, further comprising:

a bank disposed on the first planarization layer, wherein the bank defines the light-emitting areas of the light-emitting portion, wherein the bank includes first bank areas alternately arranged with the light-emitting areas of the light-emitting portion in the first direction, and second bank areas disposed in the non-light-emitting portion and extending in the first direction, wherein a thickness of the first bank areas is smaller than a thickness of the second bank areas.

\* \* \* \* \*